US009140737B2

(12) United States Patent
Mockarram-Dorri

(10) Patent No.: US 9,140,737 B2
(45) Date of Patent: *Sep. 22, 2015

(54) CAPACITIVE TOUCH SENSOR

(71) Applicant: Nokia Corporation, Espoo (FI)

(72) Inventor: Mohammad Ali Mockarram-Dorri, San Diego, CA (US)

(73) Assignee: Nokia Technologies Oy, Espoo (FI)

( * ) Notice: Subject to any disclaimer, the term of this patent is extended or adjusted under 35 U.S.C. 154(b) by 165 days.

This patent is subject to a terminal disclaimer.

(21) Appl. No.: 13/898,647

(22) Filed: May 21, 2013

(65) Prior Publication Data

US 2014/0347573 A1    Nov. 27, 2014

(51) Int. Cl.
| G06F 3/041 | (2006.01) |
| G01R 27/26 | (2006.01) |
| G06F 1/16 | (2006.01) |
| G06F 3/044 | (2006.01) |

(52) U.S. Cl.
CPC .......... *G01R 27/2605* (2013.01); *G06F 1/1692* (2013.01); *G06F 3/044* (2013.01); *Y10T 29/49155* (2015.01)

(58) Field of Classification Search
CPC .......... G06F 3/044; G06F 2203/04111; G06F 3/04886; G06F 1/169; G06F 1/1626; G06F 1/1684; G06F 2203/04107; H05K 1/0298; H05K 1/162; H05K 1/0219; H05K 1/0218
See application file for complete search history.

(56) References Cited

U.S. PATENT DOCUMENTS

| 8,274,492 | B2 | 9/2012 | Hotelling et al. | |
| 2006/0066582 | A1* | 3/2006 | Lyon et al. | 345/173 |
| 2006/0097991 | A1* | 5/2006 | Hotelling et al. | 345/173 |
| 2006/0238517 | A1* | 10/2006 | King et al. | 345/173 |
| 2008/0062139 | A1 | 3/2008 | Hotelling et al. | |
| 2008/0129317 | A1* | 6/2008 | Oba | 324/663 |
| 2009/0085891 | A1* | 4/2009 | Yang et al. | 345/174 |
| 2009/0273570 | A1 | 11/2009 | Degner et al. | |
| 2009/0295753 | A1* | 12/2009 | King et al. | 345/174 |
| 2010/0123681 | A1 | 5/2010 | Wu et al. | |
| 2010/0201647 | A1* | 8/2010 | Verweg | 345/174 |
| 2011/0025640 | A1* | 2/2011 | Lin et al. | 345/174 |
| 2011/0109573 | A1* | 5/2011 | Deslippe et al. | 345/173 |
| 2011/0248954 | A1* | 10/2011 | Hamada et al. | 345/174 |

(Continued)

FOREIGN PATENT DOCUMENTS

| EP | 2141573 A2 | 1/2010 |
| JP | 2001-324397 A | 11/2001 |

(Continued)

*Primary Examiner* — Sanjiv D Patel

(74) *Attorney, Agent, or Firm* — Harrington & Smith

(57) ABSTRACT

An apparatus including a first layer having a first substrate, first capacitive sensors on the first substrate and first electrical leads on the first substrate; and a second layer having a second substrate, second capacitive sensors on the second substrate and second electrical leads on the second substrate. The first layer is located on top of the second layer. The first capacitive sensors are arranged in a substantially ring-shaped pattern. The second capacitive sensors are arranged in a pattern sized to fit under the first layer within an inside perimeter of the substantially ring-shaped pattern of the first capacitive sensors. The second layer includes electrically conductive material spaced from the second capacitive sensors and the second electrical leads. The electrically conductive material is sized and shaped to be located under the first capacitive sensors and the first electrical leads.

20 Claims, 6 Drawing Sheets

(56) References Cited

U.S. PATENT DOCUMENTS

| | | |
|---|---|---|
| 2012/0062469 A1 | 3/2012 | Guard |
| 2012/0062506 A1 | 3/2012 | Chae et al. |
| 2012/0081328 A1 | 4/2012 | Kandziora et al. |
| 2012/0127118 A1 | 5/2012 | Nolting et al. |
| 2013/0088453 A1* | 4/2013 | Park et al. .................. 345/173 |
| 2013/0162596 A1* | 6/2013 | Kono et al. .................. 345/174 |
| 2013/0249858 A1* | 9/2013 | Chang .......................... 345/174 |
| 2014/0166464 A1* | 6/2014 | Fix et al. ....................... 200/600 |

FOREIGN PATENT DOCUMENTS

| | | |
|---|---|---|
| WO | WO-2012/053498 A1 | 4/2012 |
| WO | WO-2013/013905 A1 | 1/2013 |

* cited by examiner

CAPACITIVE TOUCH SENSOR

BACKGROUND

1. Technical Field

The exemplary and non-limiting embodiments relate generally to a touch sensor.

2. Brief Description of Prior Developments

Touch sensors, such as comprising capacitive sensors for example, are known. In the past, a touch sensor has been provided on top of an electrical display on a hand-held portable device, such as a smart phone or a tablet computer for example.

SUMMARY

The following summary is merely intended to be exemplary. The summary is not intended to limit the scope of the claims.

In accordance with one aspect, an example embodiment comprises a first layer comprising a first substrate, first capacitive sensors on the first substrate and first electrical leads on the first substrate extending from the first capacitive sensors towards side edges of the first substrate; and a second layer comprising a second substrate, second capacitive sensors on the second substrate and second electrical leads on the second substrate extending from the second capacitive sensors towards side edges of the second substrate, where the first layer is located on top of the second layer, where the first capacitive sensors are arranged in a substantially ring-shaped pattern, where the second capacitive sensors are arranged in a pattern sized to fit under the first layer within an inside perimeter of the substantially ring-shaped pattern of the first capacitive sensors, and where the second layer comprises electrically conductive material spaced from the second capacitive sensors and the second electrical leads, where the electrically conductive material is sized and shaped to be located under the first capacitive sensors and the first electrical leads.

In accordance with another aspect, an example embodiment comprises a first layer comprising a first substrate, first capacitive sensors on the first substrate and first electrical leads on the first substrate extending from the first capacitive sensors towards side edges of the first substrate; and a second layer comprising a second substrate, second capacitive sensors on the second substrate and second electrical leads on the second substrate extending from the second capacitive sensors towards side edges of the second substrate, where the first electrical leads from top and bottom rows of the first capacitive sensors extend only to top and bottom sides of the first layer, and where the first electrical leads from right and left side columns of the first capacitive sensors extend only to the top and bottom sides of the first layer, where a majority of the first leads from the right and left side columns extend along left and right side edges of the first substrate towards the top and bottom sides of the first layer for a majority of length of the first leads from the right and left side columns In accordance with another aspect, an example comprises a first layer comprising a first substrate, first capacitive sensors on the first substrate and first electrical leads on the first substrate extending from the first capacitive sensors towards side edges of the first substrate, where the first capacitive sensors are arranged in a substantially ring shaped pattern; and a second layer comprising a second substrate, second capacitive sensors on the second substrate and second electrical leads on the second substrate extending from the second capacitive sensors towards side edges of the second substrate, where the second electrical leads extend to only top and bottom side edges of the second substrate, and where the electrically conductive material on the second layer comprises a left side block, a right side block, and multiple top side and bottom side blocks at top and bottom sides of the second substrate, where gaps between the top side and bottom side blocks provide pathways for the second electrical leads to extend towards top and bottom side edges of the second substrate.

In accordance with another aspect, an example method comprises providing a first layer comprising first capacitive sensors arranged in a substantially ring-shaped pattern and first electrical conductors extending from the first capacitive sensors towards outer edges of the first layer; providing a second layer comprising second capacitive sensors and second electrical conductors extending from the second capacitive sensors towards outer edges of the second layer, where the second capacitive sensors are arranged in a pattern having a size about a same size as an inner perimeter of the substantially ring-shaped pattern; locating the first layer on top of the second layer, where electrically conductive material of the first layer is located above all the second capacitive sensors, where electrically conductive material of the second layer is located below all of the first capacitive sensors; providing a cover window on top of the first layer, where the cover window does not comprise electrically conductive material; and locating a rear side of the second layer directly against a top layer of an electrical display, where top layer of the electrical display comprises electrically conductive material.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
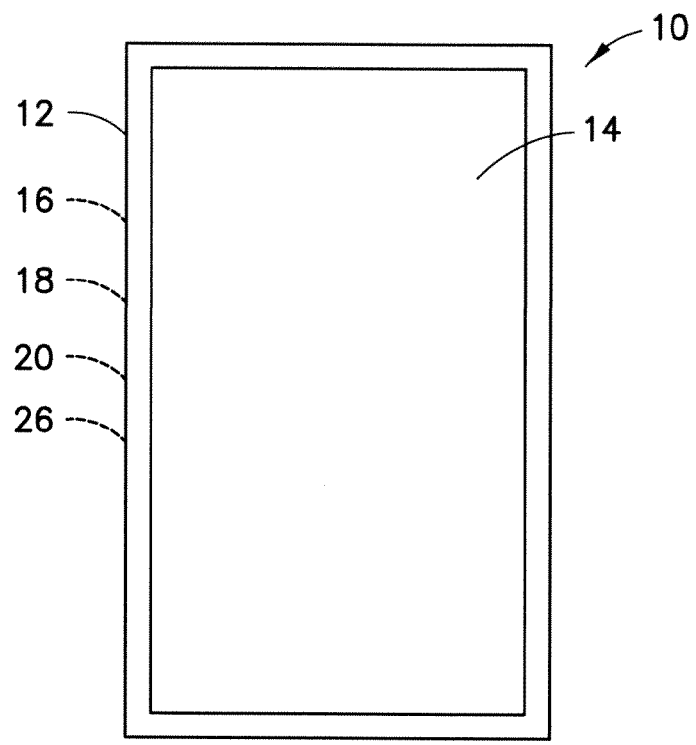
FIG. 1 is a front view of an apparatus comprising features as described herein.

Referring to FIG. 1, there is shown a front view of an apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

Figure 2:
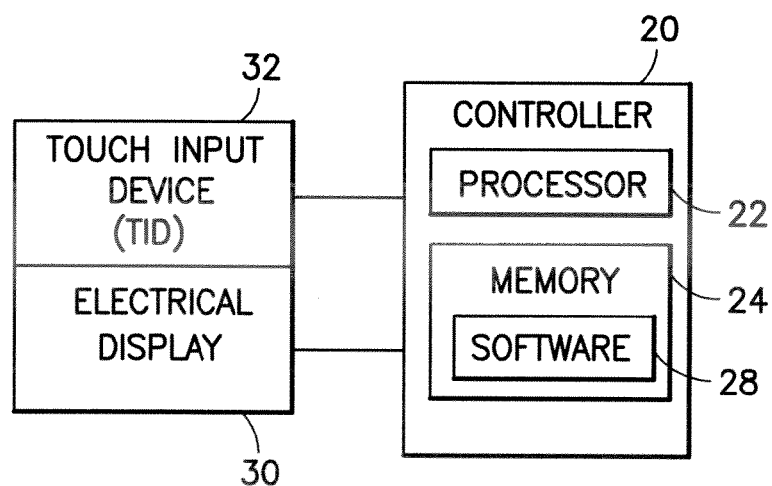
FIG. 2 is a diagram illustrating some of the components of the apparatus shown in FIG. 1.

The apparatus 10 may be a hand-held portable apparatus, such as a communications device which includes a telephone application for example. The apparatus 10 may additionally or alternatively comprise an Internet browser application, camera application, video recorder application, music player and recorder application, email application, navigation application, gaming application, and/or any other suitable electronic device application. Referring to both FIGS. 1 and 2, the apparatus 10, in this example embodiment, comprises a housing 12, a touchscreen 14, a receiver 16, a transmitter 18, a rechargeable battery 26, and a controller 20. However, all of these features are not necessary to implement the features described below. The controller can include at least one processor 22, at least one memory 24, and software 28. The electronic circuitry inside the housing 12 may comprise a printed wiring board (PWB) having components such as the controller 20 thereon. The receiver 16 and transmitter 18 form a primary communications system to allow the apparatus 10 to communicate with a wireless telephone system, such as a mobile telephone base station for example.

The touchscreen 14 in this example is a capacitive touchscreen which functions as both a display screen and as a user input. The user interface may also include a keypad or other user input device. The touchscreen 14 comprises an electrical display 30 and a touch input device (TID) 32. However, in alternate example embodiments the touch input device (TID) 32 might not be part of an electronic display, such as a touch pad for example. The touch input device (TID) 32 is a capacitive touch input device. When a user presses on the touchscreen 14 with a finger (or at least comes close to the touchscreen 14 with the finger), the touch input device (TID) 32 is configured to output a signal to the controller 20 to signal the touch event on the touch input device 32 to the controller 20, such as the location of touch event on the touch input device (TID) 32 for example.

Mobile smartphones and tablet computers commonly have capacitive touch screens or touch panels. While the designs of the sensors or electrodes for such devices vary, and some panels require shields to reduce cross-talk between the panel and the display, all touch panels and touch screens are designed to propagate an electromagnetic field to or beyond the borders of the panel and/or cover window into free space. The algorithms that are implemented in the touch panel integrated circuit (IC) are designed to measure the change in capacitive coupling between a set of electrodes and objects (fingers, hands, etc.) that approach or touch the screen. Typically the capacitive field emanated by the electrodes are non-linear over the entire surface of the screen and, hence, each sensor uses a calibration curve to linearize the output with respect to location of touch. Equally, the magnitude of the projected field varies over time due to drift in the electronics, and hence time variant AC projected fields are used and most measurements are relative. Further, the algorithms contained in the driver chips are also able to compensate for "shadowing", which occurs when extraneous objects come close to the screen and potentially obscure the desired reading. An example of this might be the capacitive image created by the palm of a hand while inputting key-strokes using a thumb.

Hence, capacitive touchscreens are sophisticated devices capable of producing a projected field and measuring changes in the field associated with localized changes in the conductivity of the space into which the field propagates. The calibrated output of these sensors is typically provided as a location and number of touch points, represented by spatial coordinates relative to the dimensions of the display. Examples of capacitive touchscreens include 2-D, 2.5-D and 3-D (3-Dimensional) capacitive sensing. A 2-D touch sensor usually involves a simple two layer structure to reference X and Y coordinates on a plane for example. A 3-D touch sensor involves a much more complex structure due to its sensitivity and routing.

Figure 3:
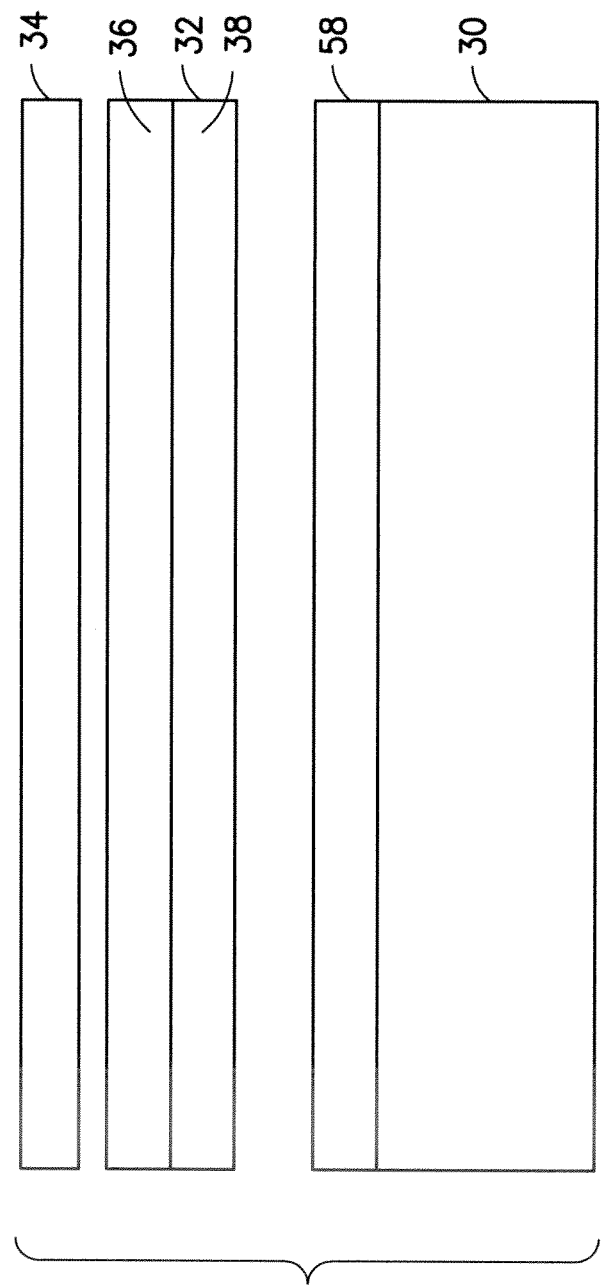
FIG. 3 is an exploded side view of components of the apparatus shown in FIGS. 1-2.

Referring also to FIG. 3, there is shown a schematic, exploded cross sectional view of the touchscreen 14. A cover window 34 is located on top of the touch input device (TID) 32. The cover window 34 does not comprise electrically conductive material, such as Indium Thin Oxide (ITO) for example; a substantially invisible conductive material. The cover window 34 may be glass or plastic for example. The touch input device (TID) 32 comprises a first or top layer 36 comprising capacitive sensors or electrodes, and a second or bottom layer 38 comprising capacitive sensors or electrodes.

Figure 4:
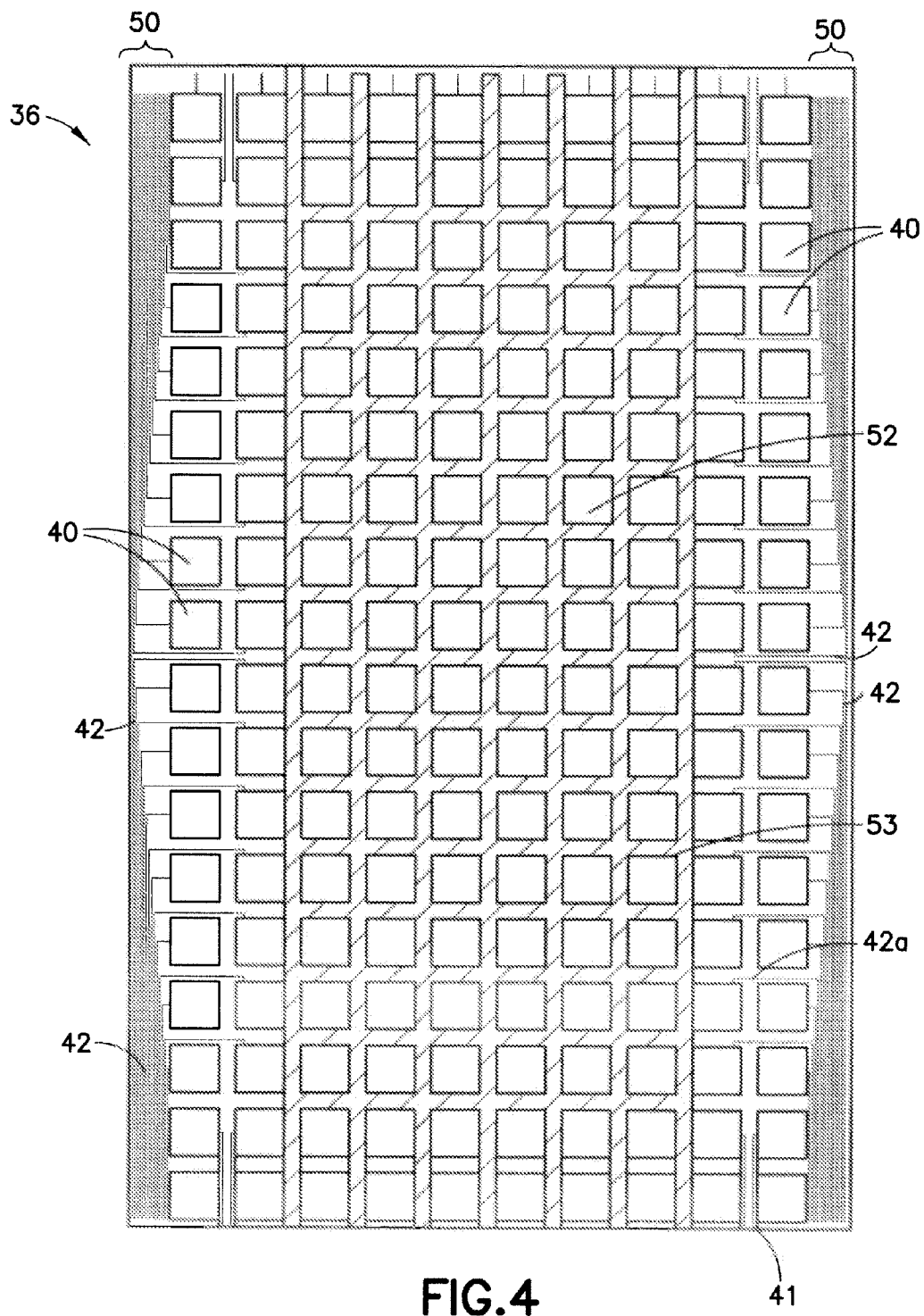
FIG. 4 is a top view of the front side of the first layer of the touch input device shown in FIG. 3.

FIG. 4 is a top view of the first layer 36, but showing the location of the substantially transparent components on that layer. The first layer 36 comprises a first substrate 41, first capacitive sensors or electrodes 40 and first electrical conductors or leads 42. The capacitive sensors 40 of the first layer 36 are arranged in a substantially ring shaped pattern. The ring shaped pattern in this example is arranged with two columns of capacitive sensors 40 on the left hand side, two columns on the right hand side, and two rows of the capacitive sensors on each of the top side and the bottom side.

Figure 7:
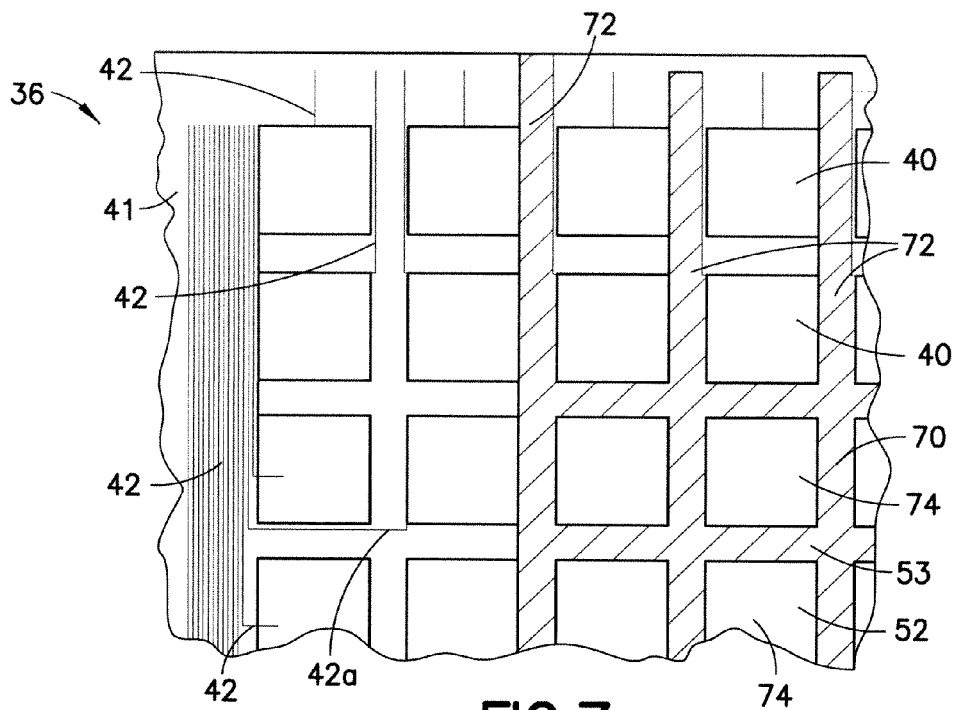
FIG. 7 is an enlarged view of a portion of the first layer shown in FIG. 4.

Referring also to FIG. 7, the first electrical conductors or leads 42 from the top and bottom rows extend substantially straight towards the respective nearby top and bottom sides of the substrate 41. The first electrical conductors or leads 42 from the left and right columns extend substantially straight towards the respective nearby left and right sides of the substrate 41, and then towards the nearby top and bottom sides of the substrate 41 along the left and right perimeters of the substrate 41. Thus, theses leads have general L shapes. The leads 42 are spaced from each other such that there is no short circuiting.

The areas 50 (see FIG. 4) along the outside left and right side perimeter of the top layer 36, which includes most of the lengths of the leads 42 of the columns (and perhaps a small portion of the sensors 40 at the outermost left and right side columns), is outside the viewable area of the touch input device 32, such as covered by a portion of the housing 12 for example. The area 52, as seen in FIG. 4, inside the inner perimeter of the substantially ring-shaped first capacitive sensors 40 of the first layer 36, forms a window area for the second capacitive sensors 40 on the second layer 38. In one type of example embodiment the first layer 36 comprises a transparent electrically conductive material 53, such as ITO for example, at the window area 52. The transparent electrically conductive material 53 at the window area 52 may be used to function as a top guard for the second electrical conductors or leads 43 on the second layer 38 as further described below.

In the example shown, the transparent electrically conductive material 53 has a lattice block shape 70 at the window area 52. The shape 70 is sized to fit in the inside perimeter of the ring shaped first capacitive sensors 40. The lattice nature of the shape 70 provides areas 74 which do not have the material 53. These areas 74 are intended to be located directly over individual ones of the second capacitive sensors on the second layer 38. The transparent electrically conductive material 53 also has top and bottom fingers 72. The fingers 72 extend from the lattice block shape 70 towards the respective top and bottom sides of the substrate 41. The fingers 72 extend between capacitive sensors 40 in the top and bottom rows.

Figure 5:
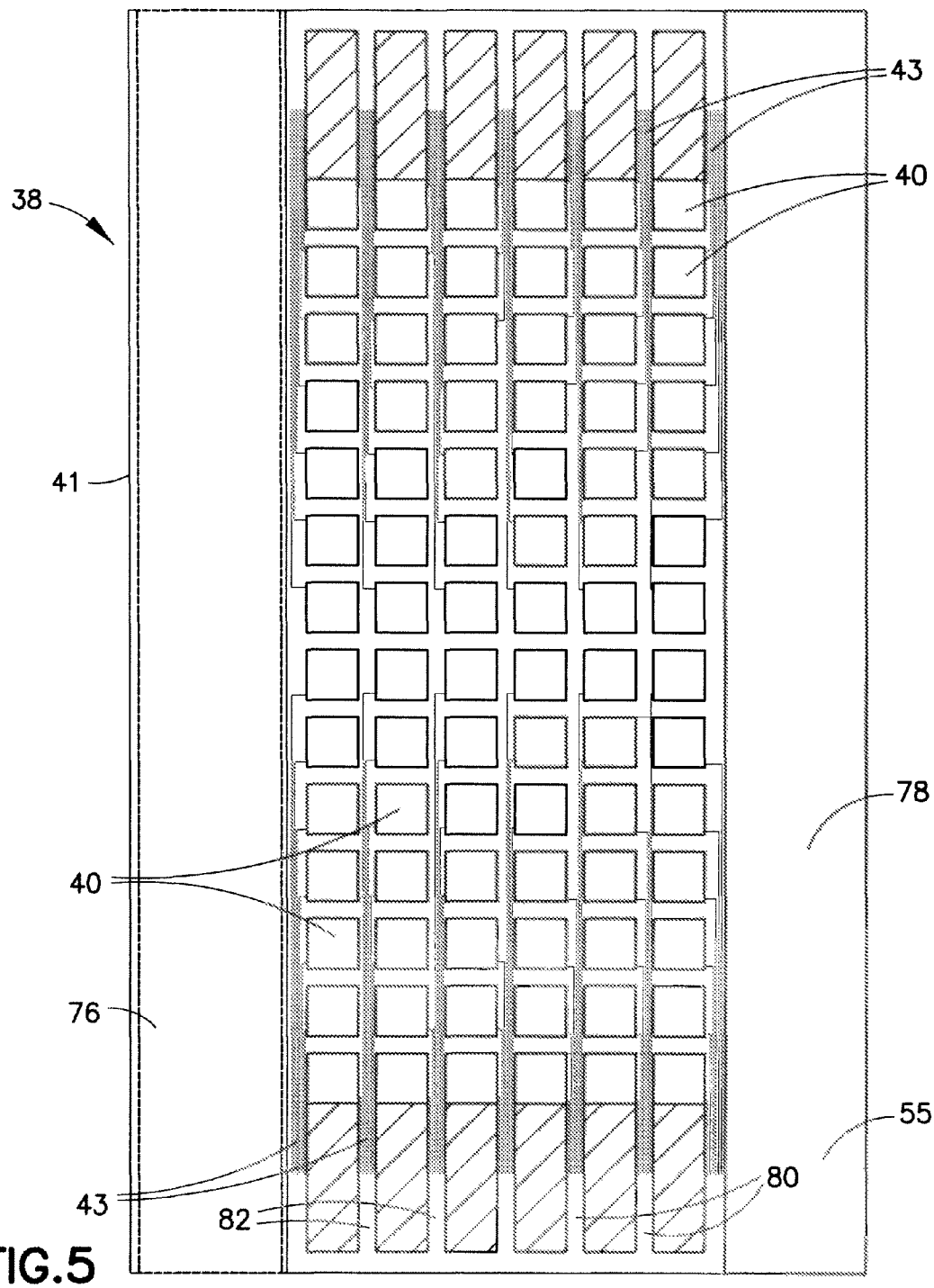
FIG. 5 is a top view of the front side of the second layer of the touch input device shown in FIG. 3.

FIG. 5 is a top view of the second layer 38, but showing the location of the substantially transparent capacitive sensors 40, the leads 43 and electrically conductive material 55 on the substrate 41 of the second layer 38. The second capacitive sensors 40 of the second layer 38 are arranged in a substantially block shaped pattern in rows and columns. In this example the block has six columns and 14 rows. The capacitive sensors of the second layer 38 are arranged in a pattern sized to fit under the first layer 36 within an inside perimeter of the substantially ring-shaped pattern of the first capacitive sensors in the first layer. In other words, the pattern of the second capacitive sensors 40 of the second layer 38 fits under the window area 52 of the first layer 36.

Figure 8:
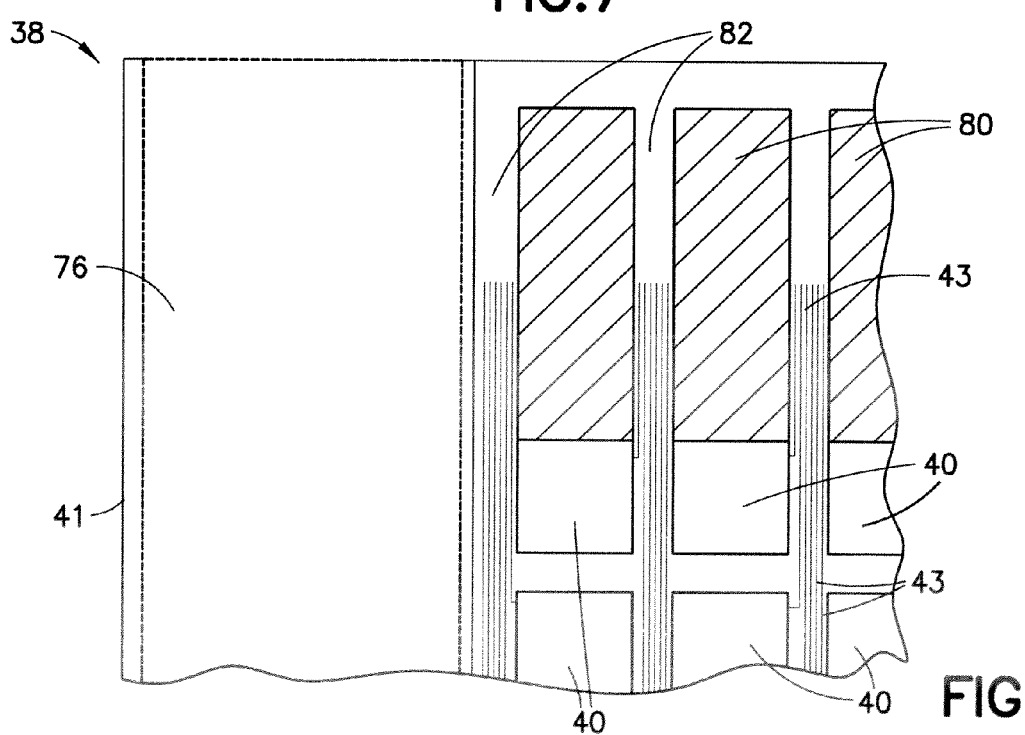
FIG. 8 is an enlarged view of a portion of the second layer shown in FIG. 5.

Referring also to FIG. 8, each of the electrical conductors or leads 43 extend towards the nearest of the top or bottom side of the substrate 41. The electrical conductors or leads 43 are spaced from each other to prevent short circuit. The front side of the substrate 41 of the second layer 38 comprises electrically conductive material 53, such as ITO for example, comprising a left side block 76, a right side block 78 and top and bottom fingers 80.

With the first and second layers 36, 38 stacked with each other, the fingers 80 are sized, shaped and located to extend directly under the middle ones of the capacitive sensors 40 in the top and bottom rows of the first layer 36. The fingers 80 are, thus, able to provide an electrical rear guard for those capacitive sensors. With the first and second layers 36, 38 stacked with each other, the left and right side blocks 76, 78 are sized, shaped and located to extend directly under the capacitive sensors 40 in the left and right side columns of the first layer 36. The left and right side blocks 76, 78 are, thus, able to provide an electrical rear guard for those capacitive sensors. Hence, guard material 53 is able to be provided under all of the capacitive sensors 40 of the first layer 36. However, gaps 82 are provided between the adjacent fingers 80 to provide a path for the leads 43. The second layer 38 has less routing traces per area due to the ability to use both sides of the series of columns. For n number of columns of capacitor sensors, we get n+1 number of columns for routing. In the example shown, as seen in FIG. 5, there are 6 columns of capacitive sensors 40 and 7 columns of routing 43. Capacitive sensors and routing can act as a rear guard for portions of the first layer 38 (when top capacitive sensors are active).

The block 70 and fingers 72 of the material 53 on the first layer 36 provides a top guard for the leads 43. The very short line portions 42a on the first layer 36 do not need a top guard. The leads 42 from all the capacitive sensors on the first layer 36 are routed as short as possible away from the active area. These short distances make it a lot less likely to get a false detect (and one can use software to help avoid false detects). There is a pattern of material 53 that will be used as an active guard for the routing/lead 43 in the second layer 38. The capacitive sensors 40 on the top layer 36 can also act as a top guard layer portions of the second layer.

Figure 6:
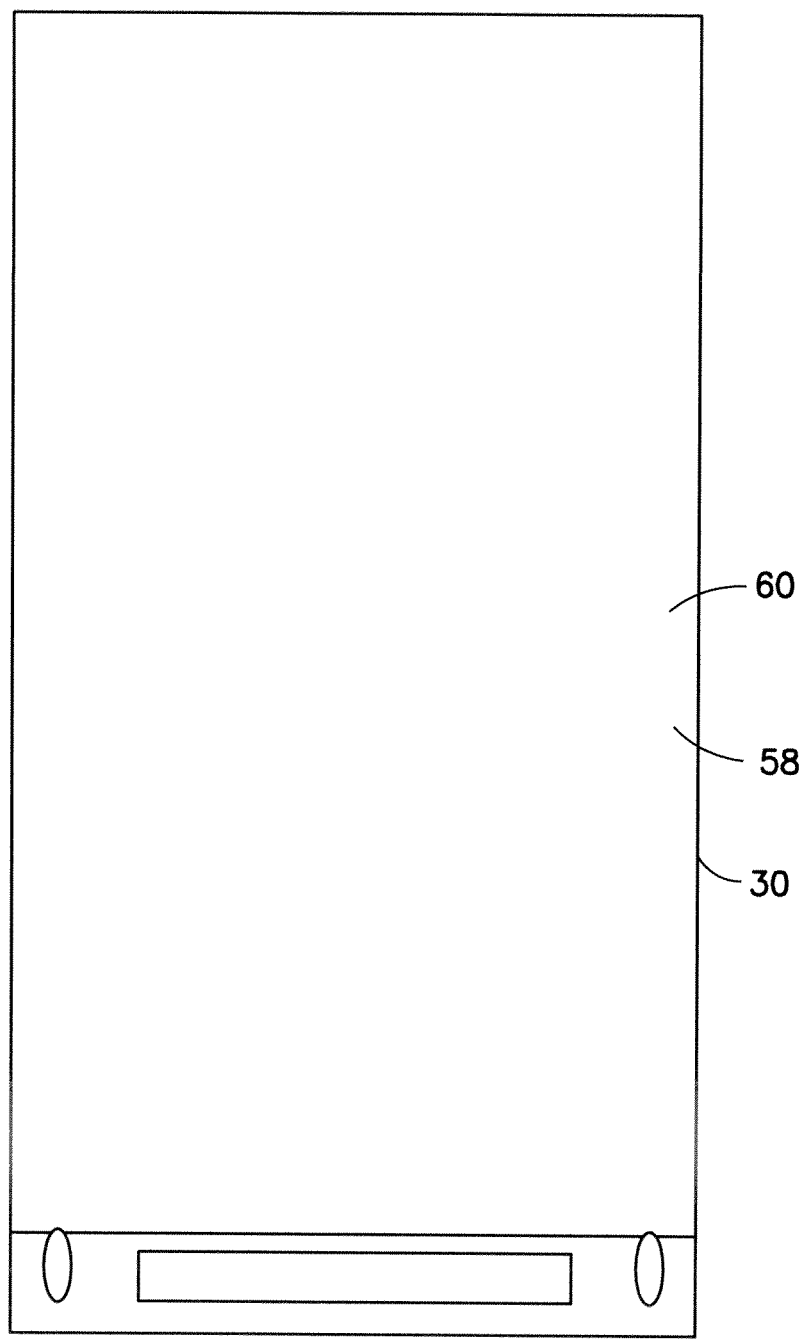
FIG. 6 is a top view of the electronic display shown in FIG. 3.

Referring also to FIGS. 3 and 6, the electrical display 30 comprises a top layer 58, such as glass for example, which comprises electrically conductive material 60, such as ITO for example. Display suppliers/manufacturers use ITO for Electrostatic Discharge (ESD) protection and to keep the reference voltage constant to avoid any optical issues if when pressing the display. Since the second layer 38 has the capacitive sensors within the display area of the display 30 (not extending outward past the edges of the display 30), one can use the display 30 to provide the rear guard layer function for the second layer 38.

Features as described herein may be used to create a pattern for a touch sensor, such as a 3-D touch sensor for example, to make the touch sensor more compact and more cost effective, and provide more efficient use of each layer. This may be used so that one does not need a top guard (provided as an electrically conductive material) on the viewable area above the first layer having the capacitive sensors. That allows one to use normal non-ITO glass as the cover window (which makes it easier to make 2.5-D shape windows and/or use a GORILLA glass window). Features as described herein may be used to reduce the number of substrates/layers with conductive material, and make the touch sensor thinner.

Features as described herein may be provided in a sensor pattern that has two layers. The top capacitive sensor layer may be designed to have very little routings/leads in the viewable area; resulting in no need for a guard layer above those leads. The bottom capacitor sensor layer may take up a small enough space that its rear side can be guarded by ITO 60 of the display 30 that is already present in the display 30.

One type of conventional 3-D capacitive touch sensor has four layers of substrates; all with conductive material. The first layer is a guard with electrically conductive material. The second layer has capacitive sensors. The third layer has capacitive sensors. The fourth layer is a bottom guard with electrically conductive material.

With features as described herein, because the top capacitor sensor layer has no routings/leads at the decorative window area 52 and almost all portions of the leads 42 are only in the non-active areas 50, there is no need for a top guard layer for the top layer 36 to have electrically conductive material. Instead, with features as described herein, conductive material 53 may be placed directly on the decoration area 52 of the top capacitive sensor layer; which is inexpensive and adds very little thickness. Also, the capacitive sensors on the bottom capacitive sensor layer takes up less area; not occupying perimeter area 55. Therefore, the rear side of the capacitor sensor layer 38 may be guarded by the display 30 without a need for a fourth layer having electrically conductive material as described above for a conventional 4-layer type of capacitive touch sensor.

A conventional 3-D structure has a guard layer on top comprising ITO, capacitor sensors (two layers of sensors), and a guard layer on bottom comprising ITO. Conventional capacitor sensors use a square shape for sensing. Underneath each conductive sensor, there needs to be an active guard layer. There needs to be a top guard for long routings going from the capacitive sensor to the A/D chip to protect from false detects. Features as described herein may be used to avoid using ITO on the in the cover window while also eliminating the rear guard layer by instead using a portion of the electrical display 30 to provide the rear guard feature.

With features as described herein, one may change the capacitive sensor pattern to allow routing/leads in the top layer 36 to an area almost entirely outside the active area. A bottom layer having capacitive sensors may have the inside capacitive sensors which need routing to the outside edges of the substrate. The routing from the capacitive sensors on the bottom layer may be less visible since it is on the bottom layer; underneath the top layer 36. The window area 52 inside the inner perimeter of the top layer of capacitive sensors may be fill with ITO for guarding the leads 43 on the bottom layer 38.

With features as described herein, an only-2-layer PET (Polyethylene Terephthalate—Plastic substrate) substrate solution, without ITO on a Window, may be provided.

The area which the capacitive sensors occupy on the bottom layer 38 may now cover a much smaller X and Y area than in a conventional capacitive sensor bottom layer. The bottom layer may provide the inner capacitive sensors. Due to the area being smaller than a conventional bottom layer having capacitive sensors, it is possible to put a smaller electrical rear guard for this layer than it would be for the whole sensor area. The top side of the bottom layer 38 may comprise ITO to function as an active rear guard for the top capacitive sensors.

Features as described herein may be used to create a compact solution while decreasing cost of the already provided solutions for 3-D sensors. A new sensor pattern may be used to take advantage of allocation of each PET layer and the display substrate. Providing ITO on a cover window has a lot of manufacturing issues and limitations. It is also difficult to get GORILLA glass treatment on a cover window with ITO. It is difficult to get 2.5-D shapes on glass cover windows with ITO on them. All of this leads to low yields and higher costs.

With features as described herein, the second layer capacitive sensor pattern is small enough to be in the display glass area. This allows the routing to be guarded by the above sensor pattern on the first layer. This also allows one to use the display to provide the rear electrical guard feature rather than adding an additional layer.

It is important that traces, what are used between a touch controller and sensors of the 3-D touch panel, are short because a capacitance of the traces cannot be too high. A conductive material may be used on the decoration area 52. Advantages include minimized routing in viewable area when a top guard layer is not needed there. A separate top guard layer is not needed if a conductive material is used on the decoration area 52. Novel features include a conductive material is used on the decoration area 52 when it is as same as the top guard layer and an additional top guard is not needed.

Existing conventional designs require either 3 to 4 layer of external substrates (either glass or pet) for ITO to be layered on top of each other. Features as described herein are able to reduce that to two layers while avoiding having to place ITO on the glass cover window. Having ITO on a glass cover window makes it difficult to manufacture 2.5-D glass and GORILLA glass. That is why it has been avoided; because it adds too much cost and yield problems. Features as described herein may provide a thinner and less expensive design, which is also more visually appealing.

An example embodiment may comprise an apparatus including a first layer comprising a first substrate, first capacitive sensors on the first substrate and first electrical leads on the first substrate extending from the first capacitive sensors towards side edges of the first substrate; and a second layer comprising a second substrate, second capacitive sensors on the second substrate and second electrical leads on the second substrate extending from the second capacitive sensors towards side edges of the second substrate, where the first layer is located on top of the second layer, where the first capacitive sensors are arranged in a substantially ring-shaped pattern, where the second capacitive sensors are arranged in a pattern sized to fit under the first layer within an inside perimeter of the substantially ring-shaped pattern of the first capacitive sensors, and where the second layer comprises electrically conductive material spaced from the second capacitive sensors and the second electrical leads, where the electrically conductive material is sized and shaped to be located under the first capacitive sensors and the first electrical leads.

The apparatus may further comprise a cover window on top of the first layer, where the cover window does not comprise electrically conductive material. The apparatus may further comprise an electrical display, where the electrical display comprises a top layer comprising electrically conductive material, where the top layer of the electrical display is located directly against a bottom side of the second layer. The first layer may comprise electrically conductive material located in an area bordered by the inside perimeter of the substantially ring-shaped pattern of the first capacitive sensors, where the electrically conductive material is spaced from the first capacitive sensors and the first electrical leads. The electrically conductive material may comprise fingers which extends through the substantially ring-shaped pattern of the first capacitive sensors towards only two opposite sides of the first layer. The first electrical leads may extend to only two of the side edges of the first substrate. The substantially ring-shaped pattern may comprise more than one column of the first capacitive sensors on right and left sides of the first substrate, and more than one row of the first capacitive sensors on top and bottom sides of the first substrate. The first electrical leads from the top and bottom rows of the first capacitive sensors may extend only to top and bottom sides of the first layer, and where the first electrical leads from the right and left side columns of the first capacitive sensors extend only to the top and bottom sides of the first layer. A majority of the first leads from the right and left side columns may extend along left and right side edges of the substrate towards the top and bottom sides of the first layer for a majority of length of the first leads from the right and left side columns. The second electrical leads may extend to only two of the side edges of the second substrate. The electrically conductive material on the second layer may comprise a left side block, a right side block, and multiple top side and bottom side blocks at top and bottom sides of the second substrate, where gaps between the top side and bottom side blocks provide pathways for the second electrical leads to extend towards top and bottom side edges of the second substrate. The first layer may comprise electrically conductive material located in an area bordered by the inside perimeter of the substantially ring-shaped pattern of the first capacitive sensors, where the electrically conductive material is spaced from the first capacitive sensors and the first electrical leads, and where the electrically conductive material comprises fingers which extends through the substantially ring-shaped pattern of the first capacitive sensors towards only two opposite sides of the first layer, where the fingers are located over the gaps. The apparatus may further comprise means for providing a capacitive touch sensor for use with an electrical display, where the capacitive touch sensor does not comprise a rear guard layer having electrically conductive material.

Another example may be provided in an apparatus comprising a first layer comprising a first substrate, first capacitive sensors on the first substrate and first electrical leads on the first substrate extending from the first capacitive sensors towards side edges of the first substrate; and a second layer comprising a second substrate, second capacitive sensors on the second substrate and second electrical leads on the second substrate extending from the second capacitive sensors towards side edges of the second substrate, where the first electrical leads from top and bottom rows of the first capacitive sensors extend only to top and bottom sides of the first layer, and where the first electrical leads from right and left side columns of the first capacitive sensors extend only to the top and bottom sides of the first layer, where a majority of the first leads from the right and left side columns extend along left and right side edges of the first substrate towards the top and bottom sides of the first layer for a majority of length of the first leads from the right and left side columns The second electrical leads may extend to only two of the side edges of the second substrate. The apparatus may further comprise a cover window on top of the first layer, where the cover window does not comprise electrically conductive material, and an electrical display, where the electrical display comprises a top layer comprising electrically conductive material, where the top layer of the electrical display is located directly against a bottom side of the second layer.

Another example may be provided in an apparatus comprising a first layer comprising a first substrate, first capacitive sensors on the first substrate and first electrical leads on the first substrate extending from the first capacitive sensors towards side edges of the first substrate, where the first capacitive sensors are arranged in a substantially ring shaped pattern; and a second layer comprising a second substrate, second capacitive sensors on the second substrate and second electrical leads on the second substrate extending from the second capacitive sensors towards side edges of the second substrate, where the second electrical leads extend to only top and bottom side edges of the second substrate, and where the electrically conductive material on the second layer comprises a left side block, a right side block, and multiple top side and bottom side blocks at top and bottom sides of the second substrate, where gaps between the top side and bottom side blocks provide pathways for the second electrical leads to extend towards top and bottom side edges of the second substrate.

The apparatus may further comprise a cover window on top of the first layer, where the cover window does not comprise electrically conductive material; and an electrical display, where the electrical display comprises a top layer comprising electrically conductive material, where the top layer of the electrical display is located directly against a bottom side of the second layer, where the first layer comprises electrically conductive material located in an area bordered by the inside perimeter of the substantially ring-shaped pattern of the first capacitive sensors, where the electrically conductive material is spaced from the first capacitive sensors and the first electrical leads, and where the electrically conductive material comprises fingers which extends through the substantially ring-shaped pattern of the first capacitive sensors towards only two opposite sides of the first layer.

An example method may comprise providing a first layer comprising first capacitive sensors arranged in a substantially ring-shaped pattern and first electrical conductors extending from the first capacitive sensors towards outer edges of the first layer; providing a second layer comprising second capacitive sensors and second electrical conductors extending from the second capacitive sensors towards outer edges of the second layer, where the second capacitive sensors are arranged in a pattern having a size about a same size as an inner perimeter of the substantially ring-shaped pattern; locating the first layer on top of the second layer, where electrically conductive material of the first layer is located above all the second capacitive sensors, where electrically conductive material of the second layer is located below all of the first capacitive sensors; providing a cover window on top of the first layer, where the cover window does not comprise electrically conductive material; and locating a rear side of the second layer directly against a top layer of an electrical display, where top layer of the electrical display comprises electrically conductive material.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
 a first layer comprising a first substrate, first capacitive sensors on the first substrate and first electrical leads on the first substrate extending from the first capacitive sensors towards side edges of the first substrate; and
 a second layer comprising a second substrate, second capacitive sensors on the second substrate and second electrical leads on the second substrate extending from the second capacitive sensors towards side edges of the second substrate,
 where the first layer is located on top of the second layer,
 where the first capacitive sensors are arranged in a substantially ring-shaped pattern,
 where the second capacitive sensors are arranged in a pattern sized to fit under the first layer within an inside perimeter of the substantially ring-shaped pattern of the first capacitive sensors, and
 where the second layer comprises electrically conductive material substantially spaced from the second capacitive sensors and the second electrical leads,
 where the electrically conductive material is located under the first capacitive sensors and the first electrical leads to form an electrical rear guard for the first capacitive sensors and the first electrical leads of the first layer, and the electrically conductive material is substantially not located on top of the second capacitive sensors and the second electrical leads of the second layer.

2. An apparatus as in claim 1 further comprising a cover window on top of the first layer, where the cover window does not comprise electrically conductive material.

3. An apparatus as in claim 1 further comprising an electrical display, where the electrical display comprises a top layer comprising electrically conductive material, where the top layer of the electrical display is located directly against a rear side of the second layer.

4. An apparatus as in claim 1 where the first layer comprises first electrically conductive material located in an area bordered by the inside perimeter of the substantially ring-shaped pattern of the first capacitive sensors, where the first electrically conductive material is spaced from the first capacitive sensors and the first electrical leads.

5. An apparatus as in claim 4 where the first electrically conductive material comprises fingers which extends through the substantially ring-shaped pattern of the first capacitive sensors towards only two opposite sides of the first layer.

6. An apparatus as in claim 1 where the first electrical leads extend to only two of the side edges of the first substrate.

7. An apparatus as in claim 1 where the substantially ring-shaped pattern comprises more than one column of the first capacitive sensors on right and left sides of the first substrate, and more than one row of the first capacitive sensors on top and bottom sides of the first substrate.

8. An apparatus as in claim 7 where the first electrical leads from the top and bottom rows of the first capacitive sensors extend only to top and bottom sides of the first layer, and where the first electrical leads from the right and left side columns of the first capacitive sensors extend only to the top and bottom sides of the first layer.

9. An apparatus as in claim 8 where a majority of the first leads from the right and left side columns extend along left and right side edges of the substrate towards the top and bottom sides of the first layer for a majority of length of the first leads from the right and left side columns.

10. An apparatus as in claim 1 where the second electrical leads extend to only two of the side edges of the second substrate.

11. An apparatus as in claim 1 where the electrically conductive material on the second layer comprises a left side block, a right side block, and multiple top side and bottom side blocks at top and bottom sides of the second substrate, where gaps between the top side and bottom side blocks provide pathways for the second electrical leads to extend towards top and bottom side edges of the second substrate.

12. An apparatus as in claim 11 where the first layer comprises first electrically conductive material located in an area bordered by the inside perimeter of the substantially ring-shaped pattern of the first capacitive sensors, where the first electrically conductive material is spaced from the first capacitive sensors and the first electrical leads, and where the first electrically conductive material comprises fingers which extends through the substantially ring-shaped pattern of the first capacitive sensors towards only two opposite sides of the first layer, where the fingers are located over the gaps.

13. An apparatus as in claim 1 further comprising means for providing a capacitive touch sensor for use with an electrical display, where the capacitive touch sensor does not comprise a rear guard layer having electrically conductive material.

14. A hand-held portable electronic device comprising:
a housing;
electronic circuitry connected to the housing, where the electronic circuitry comprises an electrical display; and
an apparatus as in claim 1 connected to the electronic circuitry, where the apparatus is located on top of the electrical display.

15. An apparatus comprising:
a first layer comprising a first substrate, first capacitive sensors on the first substrate, first electrical leads on the first substrate extending from the first capacitive sensors towards side edges of the first substrate, and first electrically conductive material substantially spaced from the first capacitive sensors and the first electrical leads; and
a second layer comprising a second substrate, second capacitive sensors on the second substrate, second electrical leads on the second substrate extending from the second capacitive sensors towards side edges of the second substrate, and second electrically conductive material substantially spaced from the second capacitive sensors and the second electrical leads, where the second electrically conductive material is located under the first capacitive sensors and the first electrical leads to form an electrical rear guard for the first capacitive sensors and the first electrical leads of the first layer, and the second electrically conductive material is substantially not located on top of the second capacitive sensors and the second electrical leads of the second layer, where the first electrically conductive material is located above the second electrical leads to form an electrical top guard for the second electrical leads of the second, layer,
where the first electrical leads from top and bottom rows of the first capacitive sensors extend only to top and bottom sides of the first layer, and where the first electrical leads from right and left side columns of the first capacitive sensors extend only to the top and bottom sides of the first layer, where a majority of the first electrical leads from the right and left side columns extend along left and right side edges of the first substrate towards the top and bottom sides of the first layer for a majority of length of the first electrical leads from the right and left side columns.

16. An apparatus as in claim 15 where the second electrical leads extend to only two of the side edges of the second substrate.

17. An apparatus as in claim 15 further comprising a cover window on top of the first layer, where the cover window does not comprise electrically conductive material, and an electrical display, where the electrical display comprises a top layer comprising third electrically conductive material, where the top layer of the electrical display is located directly against a rear side of the second layer.

18. An apparatus comprising:
a first layer comprising a first substrate, first capacitive sensors on the first substrate and first electrical leads on the first substrate extending from the first capacitive sensors towards side edges of the first substrate, where the first capacitive sensors are arranged in a substantially ring shaped pattern; and
a second layer comprising a second substrate, second capacitive sensors on the second substrate, second electrical leads on the second substrate extending from the second capacitive sensors towards side edges of the second substrate and electrically conductive material substantially spaced from the second capacitive sensors and the second electrical leads, where the electrically conductive material is located under the first capacitive sensors and the first electrical leads to form an electrical rear guard for first capacitive sensors and the first electrical leads of the first layer, and the electrically conductive material is substantially not located on top of the second capacitive sensors and the second electrical leads of the second layer,
where the second electrical leads extend to only top and bottom side edges of the second substrate, and where the electrically conductive material on the second layer comprises a left side block, a right side block, and multiple top side and bottom side blocks at the top and bottom sides of the second substrate, where gaps between the top side and bottom side blocks provide pathways for the second electrical leads to extend towards the top and bottom side edges of the second substrate.

19. An apparatus as in claim 18 further comprising:
a cover window on top of the first layer, where the cover window does not comprise electrically conductive material; and
an electrical display, where the electrical display comprises a top layer comprising third electrically conductive material, where the top layer of the electrical display is located directly against a rear side of the second layer,
where the first layer comprises first electrically conductive material located in an area bordered by the inside perimeter of the substantially ring-shaped pattern of the first capacitive sensors, where the first electrically conductive material is spaced from the first capacitive sensors and the first electrical leads, and where the first electrically conductive material comprises fingers which extends through the substantially ring-shaped pattern of the first capacitive sensors towards only two opposite sides of the first layer.

20. A method comprising:
providing a first layer comprising first capacitive sensors arranged in a substantially ring-shaped pattern and first electrical conductors extending from the first capacitive sensors towards outer edges of the first layer;
providing a second layer comprising second capacitive sensors and second electrical conductors extending from the second capacitive sensors towards outer edges of the second layer, where the second capacitive sensors are arranged in a pattern having a size about a same size as an inner perimeter of the substantially ring-shaped pattern;
locating the first layer on top of the second layer, where first electrically conductive material of the first layer is located above all the second electrical conductors, where the first electrically conductive material is located above the second electrical conductors to form an electrical top guard for second electrical conductors of the second layer, where second electrically conductive material of the second layer is located below all of the first capacitive sensors, where the second electrically conductive material is located under the first capacitive sensors and the first electrical conductors to form an electrical rear guard for the first capacitive sensors and the first electrical conductors of the first layer;

providing a cover window on top of the first layer, where the cover window does not comprise electrically conductive material; and locating a rear side of the second layer directly against a top layer of an electrical display, where the top layer of the electrical display comprises third electrically conductive material.

\* \* \* \* \*